United States Patent [19]

Sopori

[11] Patent Number: 5,358,574
[45] Date of Patent: Oct. 25, 1994

[54] DRY TEXTURING OF SOLAR CELLS

[75] Inventor: Bhushan L. Sopori, Denver, Colo.

[73] Assignee: Midwest Research Institute, Kansas City, Mo.

[21] Appl. No.: 155,385

[22] Filed: Nov. 22, 1993

[51] Int. Cl.$^5$ ............................................. H01L 25/00
[52] U.S. Cl. ................... 136/249; 437/173; 437/188; 437/196; 437/197; 437/202
[58] Field of Search ............... 437/173, 188, 197–200, 437/202, 977; 136/243, 249

[56] References Cited

U.S. PATENT DOCUMENTS

| | | | |
|---|---|---|---|
| 2,802,759 | 8/1957 | Moles | 148/1.5 |
| 4,321,104 | 3/1982 | Hasegawa et al. | 156/643 |
| 4,322,571 | 3/1982 | Stanbery | 437/977 |
| 4,359,486 | 11/1982 | Patalong et al. | 437/188 |
| 4,468,308 | 8/1984 | Scovell et al. | 437/188 |
| 4,525,221 | 6/1985 | Wu | 148/1.5 |
| 4,983,547 | 1/1991 | Arima | 437/200 |
| 5,166,095 | 11/1992 | Hwang | 437/188 |
| 5,175,125 | 12/1992 | Wong | 437/188 |
| 5,219,790 | 6/1993 | Miyatake | 437/173 |
| 5,223,453 | 6/1993 | Sopori | 437/173 |
| 5,232,674 | 8/1993 | Mukai et al. | 437/173 |

Primary Examiner—R. Bruce Breneman
Assistant Examiner—Ramamohan Rao Paladugu
Attorney, Agent, or Firm—Edna M. O'Connor

[57] ABSTRACT

A textured backside of a semiconductor device for increasing light scattering and absorption in a semiconductor substrate is accomplished by applying infrared radiation to the front side of a semiconductor substrate that has a metal layer deposited on its backside in a time-energy profile that first produces pits in the backside surface and then produces a thin, highly reflective, low resistivity, epitaxial alloy layer over the entire area of the interface between the semiconductor substrate and a metal contact layer. The time-energy profile includes ramping up to a first energy level and holding for a period of time to create the desired pit size and density and then rapidly increasing the energy to a second level in which the entire interface area is melted and alloyed quickly. After holding the second energy level for a sufficient time to develop the thin alloy layer over the entire interface area, the energy is ramped down to allow epitaxial crystal growth in the alloy layer. The result is a textured backside an optically reflective, low resistivity alloy interface between the semiconductor substrate and the metal electrical contact layer.

25 Claims, 4 Drawing Sheets

DRY TEXTURING OF SOLAR CELLS

CONTRACTUAL ORIGIN OF THE INVENTION

The United States Government has rights in this invention under Contract No. DE-AC0283CH10093 between the U.S. Department of Energy and the National Renewable Energy Laboratory, a Division of Midwest Research Institute.

BACKGROUND OF THE INVENTION

1. Field of the Invention

The present invention relates generally to fabrication of photovoltaic semiconductor devices in which optical confinement features increase photo conversion efficiency and more particularly to texturing of surfaces to enhance optical confinement in the semiconductor device.

2. Description of the Prior Art

Photovoltaic semiconductor devices that capture incident electromagnetic radiation, such as light radiation from the sun or other light sources, and convert the radiation to electricity are more efficient converters if more of the incident light can be absorbed in the crystal lattice and converted to electricity, instead of merely passing entirely through the device, being reflected back out of the device, or being absorbed, but converted to heat instead of electricity. Antireflective coatings are used to increase transmittance of incident light into the semiconductor material, and it is know that textured surfaces can scatter light in the semiconductor device to decrease likelihood of transmittance of the light all the way through or loss by reflection off the back surface and then transmittance out the front surface. Therefore, surface texturing has been used to reduce surface reflectance and to produce broad-band antireflection (AR) characteristics as well as to produce optical confinement by scattering light in a way that ensures multireflection with total internal reflections at cell surfaces or interfaces. However, texturing processes and results have not been entirely satisfactory prior to this invention, as will be described below.

Several techniques have been developed prior to this invention for texturing surfaces of semiconductor devices, including masked chemical etching, unmasked chemical etching, and laser grooving. Front surface etching has been used to reduce surface reflectance and to scatter incoming, normally-incident light at oblique angles within the device. However, a disadvantage of front side texturing is that it causes an increased dark current, hence a lower open circuit voltage and fill factor, i.e., lower quality and less efficient photovoltaic cell. Also, texturing on the junction side of a semiconductor device, which is usually, but not necessarily always, on the front side, with previously used techniques, can result in textured peaks that break the junction and cause shunting, thus serious damage to or destruction of the device. Therefore, backside texturing is preferred over front side texturing, if other antireflective measures, such as AR coatings, are used on the front surface.

Backside texturing, however, also has had its problems, one of the most significant of which is that the backside is usually used for the metal electrical contact. Thus, backside texturing in previously used processes involves chemical etching or otherwise texturing the back surface prior to deposition of the metal contact layer, which requires masking the front surface to avoid damage during the backside etching process. The device then has to be thoroughly cleaned before deposition of the metal contact layer. Since conventional deposition processes, such as vapor deposition, sputtering, or electrolytic precipitation deposit material uniformly, the outside surface of the metal contact layer will also be textured corresponding to the textured semiconductor surface. Also, the initial semiconductor/metal interface, while bonded in the deposition process, still has a high resistivity that must be lowered substantially, either by alloying or sintering, in order to be useful as an electric contact for the photovoltaic device. Alloying generally creates a better bond and a lower resistivity interface, although sintering is often used, especially on the side of the junction, to avoid other problems such as damage to the junction, that can result from conventional alloying techniques. However, conventional alloying, even with the newer rapid thermal alloying (RTA) techniques, is difficult to control and tends to create a deep, graded alloy layer at the semiconductor/metal interface that absorbs light and dissipates the energy as heat, instead of reflecting the light back into the semiconductor material where it can be absorbed and convened to electricity.

SUMMARY OF THE INVENTION

Accordingly, it is a object of this invention to provide a better method of increasing optical confinement within the semiconductor substrate.

It is a more specific object of this invention to provide a better method of texturing the back surface of semiconductor substrates to increase optical confinement within the semiconductor substrate.

An even more specific object of this invention to provide a method of texturing the backside of a semiconductor material and alloying a metal layer on the textured backside such that the alloy interface has both low electrical resistivity and high optical reflectivity.

To achieve the foregoing and other objects and in accordance with the purposes of the present invention, as embodied and broadly described therein, the method of this invention includes the back surface texturing and the alloying of a metallized semiconductor material utilizes a unique form of optical processing by illuminating the front side of the semiconductor substrate with electromagnetic radiation from the top surface according to a predetermined time schedule of energy levels and with an electromagnetic spectrum that is tuned to provide sufficient heat to texture the back surface of the semiconductor device and then alloy the bottom metal layer to the semiconductor substrate. The illuminating radiation, typically rich in the infrared region depending on the materials being used, is substantially transmitted through the semiconductor substrate to the interface between the bottom layer of metal and the bottom surface of the semiconductor substrate. This normally incident radiation at the bottom interface produces heating at isolated, spaced-apart locations in the bottom metal-semiconductor interface to a temperature sufficient to create diffusion pits and spikes in the semiconductor substrate surface with controllable density and size and then to a temperature sufficient to alloy the pits and spikes along with a thin layer of the metal with the semiconductor substrate over the entire semiconductor/metal interface area.

BRIEF DESCRIPTION OF THE DRAWINGS

The accompanying drawings, which are incorporated in and form a part of the specifications, illustrate the preferred embodiments of the present invention, and together with the descriptions serve to explain the principles of the invention.

In the Drawings

DETAILED DESCRIPTION OF THE PREFERRED EMBODIMENTS

Figure 1:
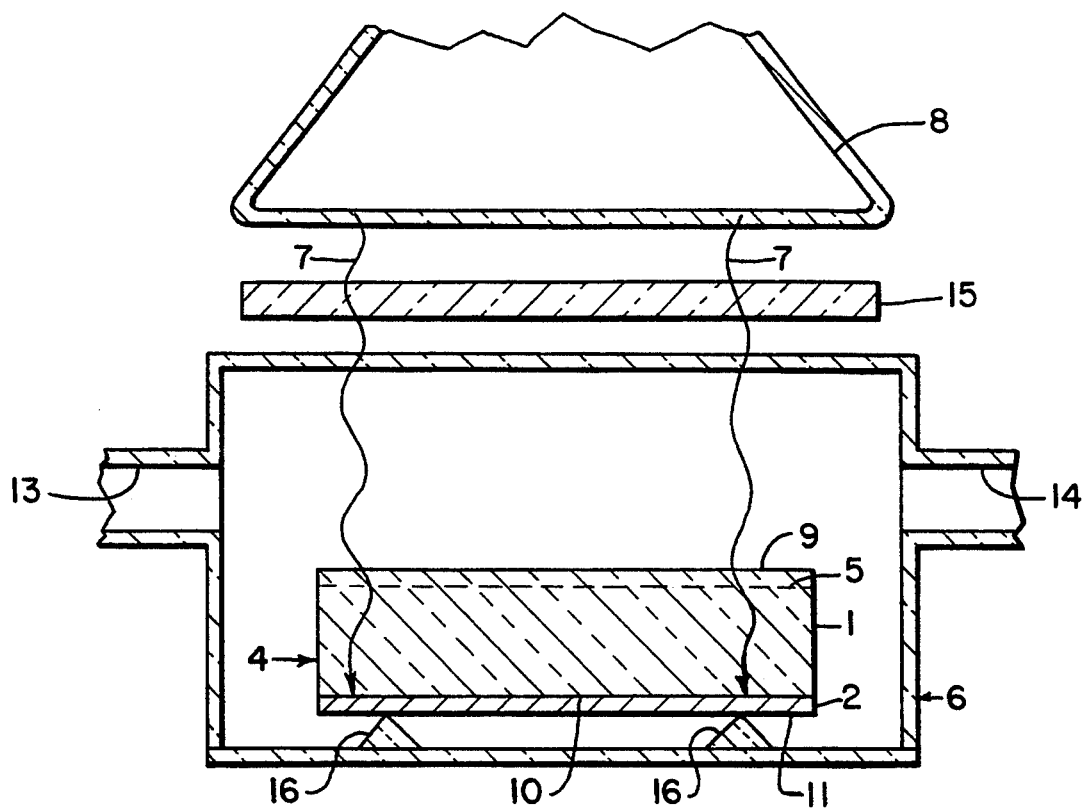
FIG. 1 is a an elevation view of a semiconductor device, such as a solar cell, that is being back surface textured and alloyed within a schematically drawn quartz chamber according to this invention.
Figure 6:
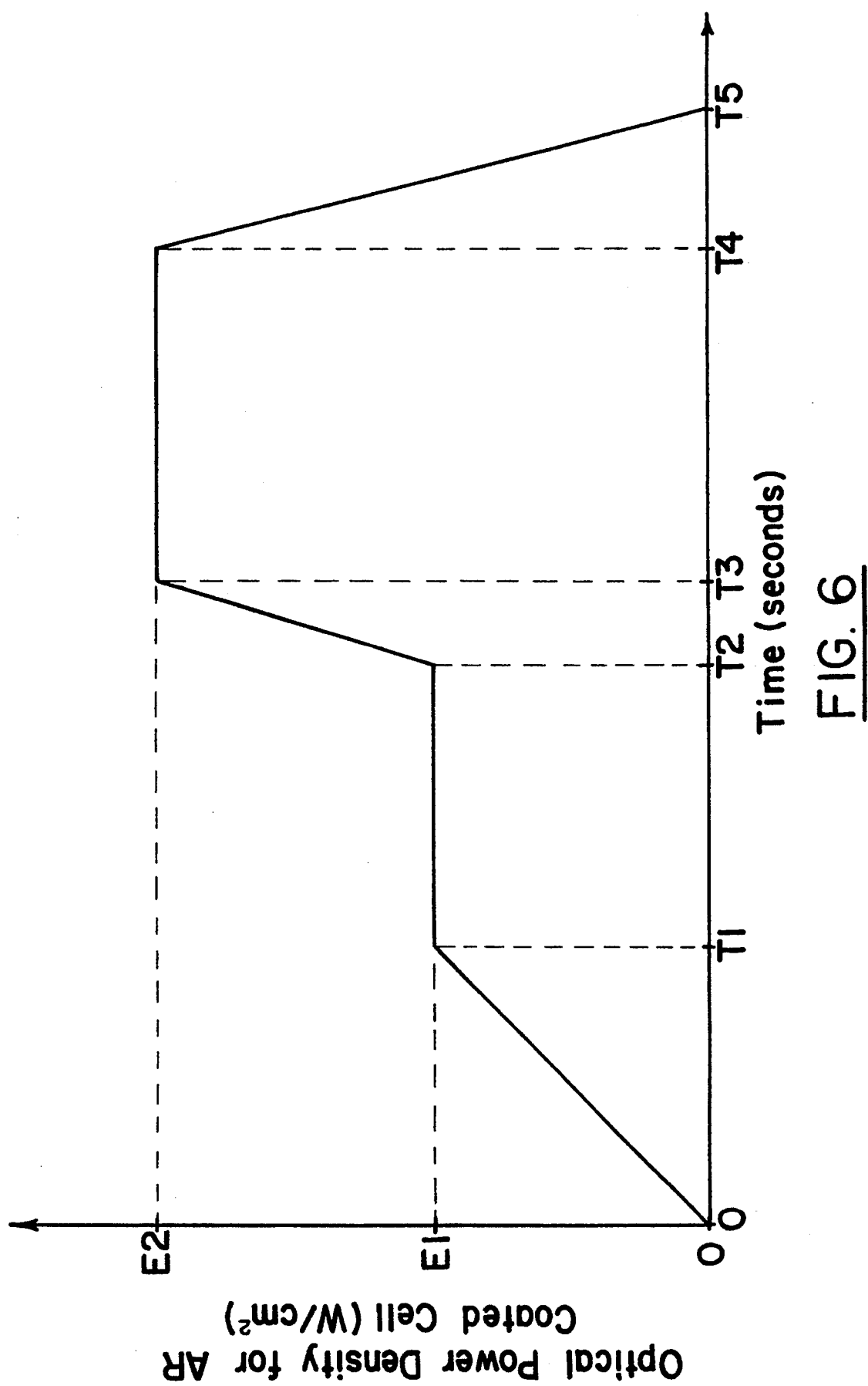
FIG. 6 is a graph of the energy levels versus time of the incident electromagnetic radiation for the preferred embodiment of the invention.

The one-sided infrared light texturing and alloying method for alloying the bottom surface 10 of semiconductor substrate 1 with a metal contact layer 2 while simultaneously texturing the bottom or backside 10 according to this invention is illustrated in FIG. 1. A semiconductor device 4 comprising a semiconductor substrate 1 doped and fabricated with a p-n junction 5 adjacent its front side or first surface 9 and a metal electrical contact 2 deposited on its backside or second surface 10 is shown positioned in a quartz muffle 6. The quartz muffle is transparent, so the semiconductor device 4 can be illuminated with electromagnetic radiation 7 from an electromagnetic radiation source 8. A predetermined wavelength, or combination of wavelengths preferably comprising infrared radiation, is directed onto the front side 9 according to an incident energy-time schedule or profile as illustrated in FIG. 6, which will be described in more detail below. The electromagnetic radiation source 8 is designed preferably to illuminate the front side 9 of the semiconductor material 1 in a substantially uniform manner over substantially the entire surface area of front side 9 for best results. The radiation 7, as mentioned above, is preferred to be primarily, if not exclusively, in the infrared range to produce heat in a unique manner to produce texturing according to this invention, as will be described in more detail below. Therefore, an optical filter 15 can be provided to filter out other extraneous wavelengths that might be produced by the source 8. In the event a particular application or combination of materials makes it desirable to include some additional wavelength radiation, such as visible/or ultraviolet, the filter 15 could be chosen to also pass such desired additional wavelengths. The selection of the spectrum is preferably made such that the steady-state temperature gradients produced in the device during the process cycle is mild, so as to prevent generation of crystal defects, such as dislocations.

The illustrations of semiconductor device 4 and its various portions or components in FIGS. 1 through 5 are not intended to be drawn to scale or even in proportion, since the very thin components and layers of the semiconductor device 4 are impractical, if not impossible, to illustrate to scale or in proper proportion. Therefore, those figures are for illustrative purposes only, as will be understood by persons skilled in this art.

The semiconductor material 1 of the semiconductor device 4 is largely transparent to the infrared electromagnetic radiation 7 emitted from the electromagnetic radiation source 8. Therefore, most of the infrared electromagnetic radiation 7 incident on the front side 9 is transmitted to the backside or second surface 10 of the semiconductor material 1, as illustrated generally in FIG. 1, where it is absorbed by the metal contact layer 2 or in the semiconductor/metal interface at backside surface 10 and converted to heat. The heat generated at the semiconductor/metal interface 10 first causes pit formation and diffusion at divers, isolated locations to texture the backside surface 10 and then alloys metal from metal layer 2 with the semiconductor material 1 at the interface 10, as will be described in more detail below. For purposes of this description, the backside or second surface and the interface of the semiconductor material 1 with the metal layer 2 are designated with the same reference number 10 for purposes of clarity, because they are both at essentially the same location or feature of the semiconductor device 4.

This method of texturing the backside or interface 10 by creating pits and corresponding spikes and then alloying the semiconductor material 1 and metal 2, according to this invention, without illuminating the back surface 11 of metal 2 is referred to in this specification as one-sided infrared light texturing and alloying, because the illumination is from just one side of the device 4, usually the top surface 9, as opposed to conventional optical alloying which directs electromagnetic radiation from at least the bottom or metal side, if not from all directions, and because the back surface 11 of the metal 2 is not illuminated externally at all.

The fabrication of a semiconductor device 4 usually begins with a semiconductor substrate 1 having a top surface 9 and a bottom surface 10. The semiconductor substrate can include both p-type and n-type semiconductor material to form a p-n junction 5, which is illustrated in FIG. 1 adjacent the top surface 9. A junction adjacent the bottom surface 10 is possible, but not preferable, because the pit and spike formation at the interface 10 could protrude into the junction and short circuit it, thus seriously damaging or "killing" the semiconductor as an electricity producing device. The metal layer 2, as mentioned above, is usually deposited on the bottom surface 10 of the semiconductor substrate 1 to function as an electrical contact for the device 4. For the purpose of providing a detailed description and an enabling embodiment, but not for the purpose of limitation, this description refers to a silicon semiconductor substrate 1 with a thin layer 2 of aluminum deposited on its bottom surface 10. The method of this invention, however, can be used on all types of metallized semiconductors, and the present invention should not be regarded as limited to the specific silicon and aluminum metallized semiconductors shown and described herein.

A semiconductor device 4 comprising a silicon substrate 1 having an aluminum layer 2 deposited on its bottom surface 10 is processed according to this invention, by illuminating the top surface 9 of the semiconductor device 4 with optical energy of a predetermined energy level, duration, and wavelength according to the timing schedule or energy-time profile illustrated that is in FIG. 6, as will be described below. The electromagnetic radiation source 8 shown in FIG. 1, such as a tungsten-halogen lamp, illuminates the semiconductor device 4 with infrared-rich electromagnetic radiation 7, i.e., electromagnetic radiation having significant power in the wavelengths of about 700 nanometers or longer, so that the electromagnetic radiation 7 is incident substantially normal to the semiconductor device 4. The incident infrared electromagnetic radiation 7 is mostly transmitted through the silicon substrate 1 to the aluminum layer 2 deposited on the bottom surface 10 of the silicon substrate 1. Therefore, there is little or no absorption of the infrared radiation in the semiconductor substrate, thus little or no extraneous heating of the silicon substrate 1 from the infrared portion of the incident electromagnetic radiation 7. Instead the transmitted infrared electromagnetic radiation 12 is absorbed by the aluminum layer 2 or at the interface 10 and converted into heat sufficient to form pits and spikes and to melt and alloy the aluminum to the bottom surface 10 of the silicon substrate 1, as described in more detail below. This process creates textured uniform Si—Al alloy layer 3 at the interface 10 between the silicon substrate 1 and the aluminum layer 2, as will also be described in more detail below.

Figure 2:
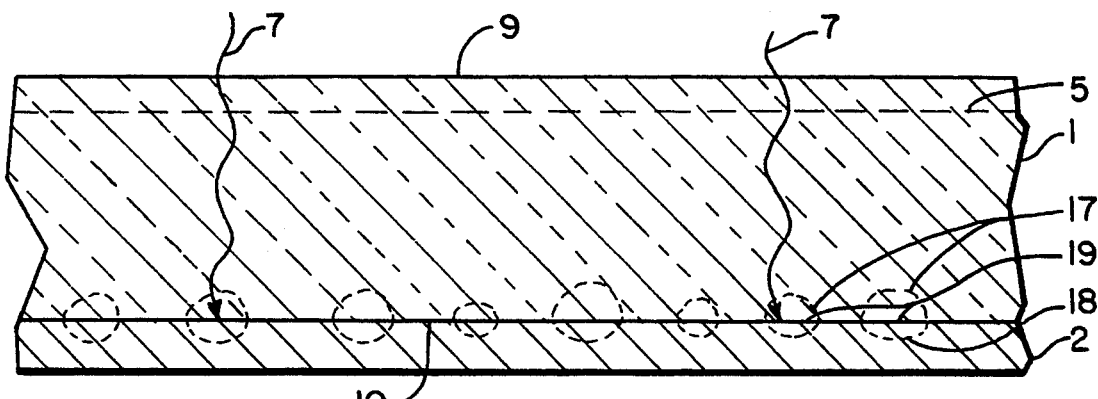
FIG. 2 is an enlarged cross-sectional view of a semiconductor device illustrating the initial hot spots that form as precursors of pits and spikes during processing according to this invention.

Referring now primarily to FIG. 2 in combination with FIG. 6, in the preferred embodiment of the present invention, the energy level of the illuminating electromagnetic radiation 7 is raised or ramped up uniformly over a first time interval between zero (0) and a first time T1 until it reaches a first energy level E1 in a range referenced according to this invention as the diffusion regime and then to a second energy level E2 in a range referenced according to this invention as the melt regime. This first energy level E1 produces sufficient heat and enhanced diffusion at localized spots 19 at the interface 10 to begin to diffuse Si into Al at the interface 10. The normal melting point of aluminum is about 800° C., and the melting point of silicon is about 1,400° C. However, the first energy level E1, while high enough to create a rapid diffusion of silicon in area 18 adjacent the interface 10, as illustrated in FIG. 2, is not high enough or intense enough to melt either the silicon or the aluminum uniformly over the entire area of the interface 10. Instead, the illumination of the semiconductor/metal interface 10, as described above and according to this invention, produces isolated hot spots 19 at divers locations across the interface 10 in a new effect, observed by the inventor, in which the semiconductor/metal interface 10 reactions, such as diffusion and melting, are enhanced by the presence of the photons that reach the interface 10. The exact mechanism at the atomic level that produces this enhanced diffusion and melting effect at the interface 10 is not known; however, it is believed that this process occurs within a very short period of time, such as a fraction of a second. Therefore, at this first energy level E1, spots 19 of localized diffusion are formed, and heat dissipates upwardly into the silicon material 1 at those hot spots 19 and causes localized diffusion of silicon down into adjacent localized areas 18 of aluminum. This initial diffusion at localized hot spots 19 is believed to be more akin to that which occurs in sintering rather than complete melting as required for a normal melted alloy process. Sintering usually occurs at a lower temperature than alloy melting. It is not know what temperatures occur at those precise hot spots 19 to produce the diffusion, although temperatures measured on the top surface 9 and bottom layer 2 during this process stay at about 400° C. Since both silicon and aluminum conduct heat very rapidly, and since the normal melting temperature of aluminum is 800° C. and silicon is about 1,400° C., the photon effect at the interface 10 possibly increases temperature at the hot spots 19, lowers the effective diffusion or melting temperatures at those spots 19, or both. Once it happens, diffusion of the silicon into the aluminum and vice-versa at those spots 19 occurs very quickly. Further, since diffusion coefficient of the silicon or other semiconductor material 1 depends on the crystal orientation, the silicon diffuses to produce "pits" 17 bounded by (1-1-1) surfaces, thus sharply defined pyramid shapes.

Figure 3:
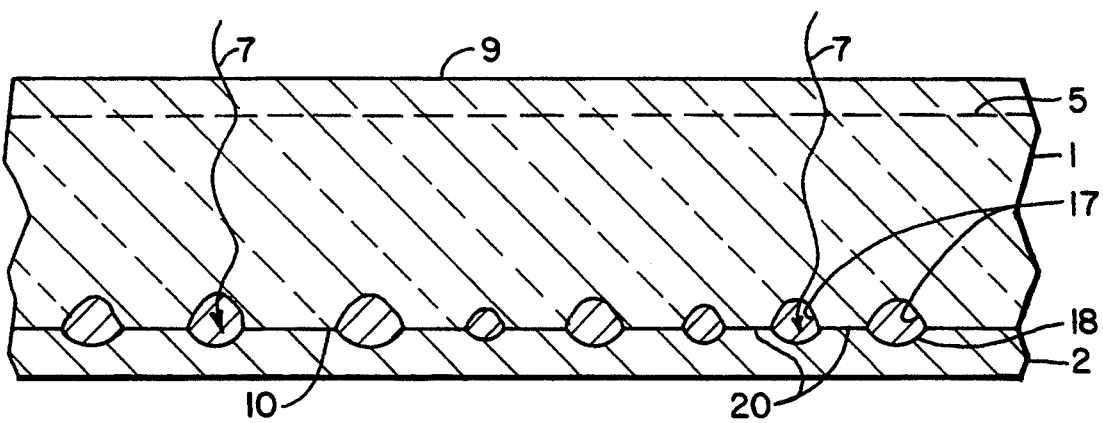
FIG. 3 is an enlarged cross-sectional view similar to FIG. 2, but illustrating the formation of pit and spike texturing according to this invention.

After time T1, the energy level E1 is held substantially constant during a second time interval extending from T1 to a second time T2. During the second time interval between T1 and T2, the E1 energy level holds a sufficient temperature for a sufficient time to allow the silicon at the local hot spots 19 to diffuse into the aluminum and thereby leave the small voids or "pits" in the silicon substrate 1, as indicated by the broken line peaks 17 in FIG. 2. Those "pits" 17 can then fill with melted aluminum 18 or with a mixture of the melted aluminum and silicon to become "spikes" 17, while the aluminum and the silicon at other areas 20 of the interface 10 remain undiffused, unmelted and not mixed with the melted aluminum 18, as illustrated in FIG. 3. Generally, larger values of E1 during this second time interval result in a greater density of "pit" 17 formation, although the energy level E1 and consequent temperature, whatever it is, in the spots 19 is kept in the diffusion regime and not increased into the melt regime during the time interval between T1 and T2. Generally, the longer the second time interval between T1 and T2 the larger the "pits" 17 that will be formed. Therefore, the energy level E1 can be adjusted within the range of the diffusion regime to affect the density of the pits 17 over the interface 10 area, and the second time interval from T1 to T2 can be adjusted to affect the sizes of the pits 17 formed at the interface 10.

Figure 4:
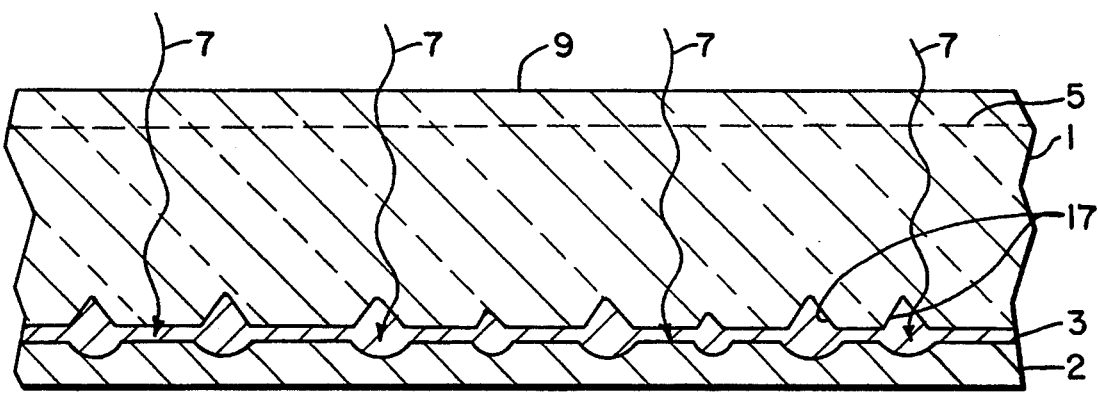
FIG. 4, is an enlarged cross-sectional view similar to FIGS. 2 and 3, but illustrating the advanced stage of alloying across the entire interface area after formation of the pits and spikes texturing.

During the third time interval between T2 and a third time T3, the energy level is uniformly raised at a very rapid rate to a second, higher energy level E2, which rapidly produces high enough temperatures over the entire area of interface 10 into the melt regime, which melts a thin layer 3 of aluminum and silicon very rapidly in both the diffused spots 17 and the previously unmelted areas 20 between the diffused spots 17, as shown in FIG. 4. This result leads to dissipation of heat laterally across the melted interface layer 3, rather than vertically into the silicon substrate 1, which effectively stops the formation and growth of the "pits" or "spikes" 17. The energy level is then held constant at the second energy level E2 during a fourth time interval between T3 and a fourth time T4 sufficient to allow mixing or alloying of melted aluminum with melted silicon over the entire interface 10 area to complete the thin Si—Al alloy layer 3 between the silicon substrate 1 and the metal electrical contact 2, but not so long as to lose the "pits" or "spikes" 17 that provide an effective textured backside surface on the silicon substrate 1 and not so long as to let the Si—Al alloy layer get too thick to function as an abrupt reflective surface. Finally, during the fifth time interval between T4 and a fifth time T5, the energy level is lowered from E2 to zero (0) at a fairly uniform, controlled rate to allow epitaxial crystal growth in the thin Si—Al alloy layer 3, which forms a low electrical resistivity connection between the silicon substrate 1 and the aluminum contact layer 2.

It is important that energy level E1 be sufficiently less than energy level E2 to ensure that "pit" 17 formation occurs in the diffusion regime, without interface melting and alloy formation over the entire area of the interface 10. The time interval between T4 and T5 determines the thickness of the Si—Al alloy interface 3. The longer the time interval, the thicker the Si—Al alloy interface. The thickness of the Si—Al interface 3 can also be increased by increasing the value of E2. The time intervals and the optical power must be controlled so that the interface melts as an alloy. Typically, the total alloying time is less than two minutes. The method described herein results in a highly controlled textured backside on the semiconductor substrate 1 followed by an epitaxial growth of a highly reflective thin layer 3 of Si—Al alloy between the silicon substrate 1 and the aluminum layer 2 that has a very low electrical resistivity. The resulting Si—Al alloy is an eutectic composition in that its melting point is lower than the melting point of either of its individual components.

Figure 5:
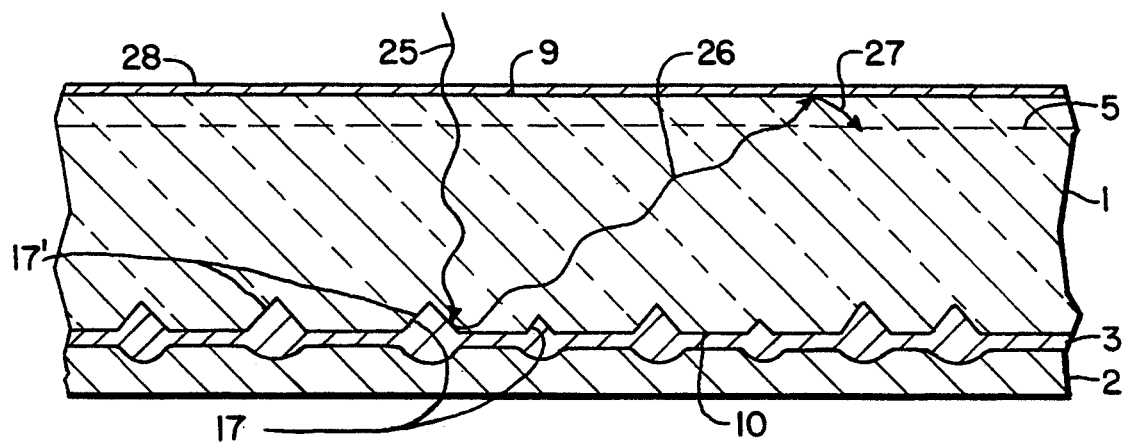
FIG. 5 is an enlarged cross-sectional view similar to FIGS. 2, 3, and 4, showing the finished textured and alloyed backside and its light scattering effect in the semiconductor device.

The finished semiconductor device 4 is shown in FIG. 5 with a plurality of pits 17 in the backside of the semiconductor substrate 1, which are filled with Si—Al alloy in the form of "spikes" 17' extend upwardly from the thin Si—Al alloy layer 3 into the semiconductor substrate 1. Because of the energy and time controls during processing, the Si—Al alloy layer 3 with its spikes 17' are epitaxial crystal structured, but quite abrupt, i.e., not graded extensively into the semiconductor substrate 1, so that it has a high optical reflectivity. Consequently, during use of the semiconductor device 4, for example, as a photovoltaic cell, any incident light 25 that is not absorbed by the semiconductor substrate 1 and converted to electricity by the p-n junction 5 or convened to heat will reach the textured backside 10, where it will be reflected by the alloy layer 3 back into the semiconductor substrate 1 for a second chance at absorption therein. Such reflected light 26 may be scattered by the pits 17 and spikes 17', as shown in FIG. 5, so that its path through the semiconductor substrate 1 is at an angle, thus longer, to increase the likelihood of absorption. Further, if the radiation 26 is reflected at an angle, as shown in FIG. 5, but still not absorbed, it will strike the surface 9 at an angle, thus enhancing the likelihood of a third or more passes through the semiconductor substrate 1, as indicated at 27, to further increase chances of absorption. The semiconductor device 4 is shown in FIG. 5 with an antireflective (AR) coating 28 on the front side 9 to enhance the initial transmission of light 25 into the semiconductor substrate 1, which is known in the art and not a part of this invention.

Figure 7:
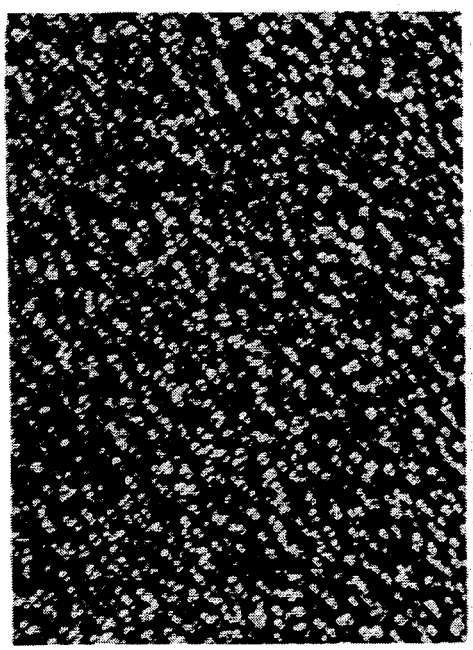
FIG. 7 is a photograph showing backside texture or "pit" density.
Figure 8:
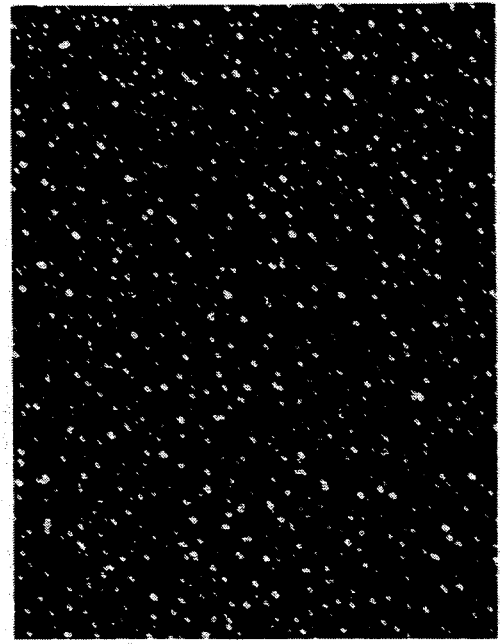
FIG. 8 is a photograph showing a smaller "pit" density.
Figure 9:
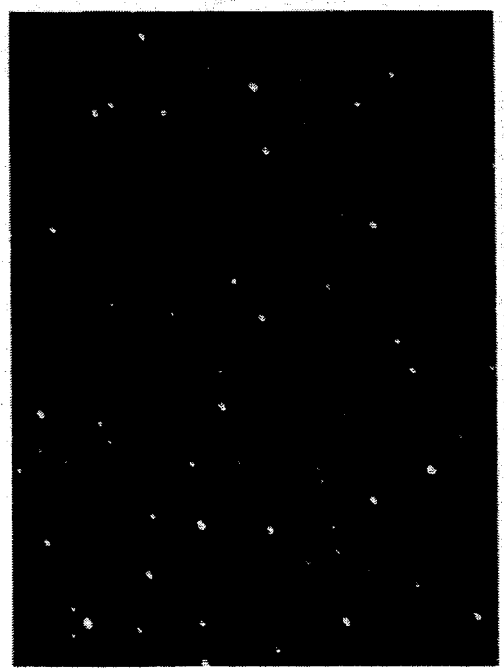
FIG. 9 is a photograph showing even lower "pit" density.

Referring now primarily to FIG. 6, in the preferred embodiment of this invention, when it is used to process a silicon semiconductor chip with an aluminum electrical contact on the backside, the energy is initially ramped up at a fairly constant rate of increase from zero to a first energy level E1 in the range of about 1.5 to 3.0 watts per square centimeter ($W/cm^2$) (preferably about 2.5 $W/cm^2$) in a first time interval from zero to a first time T1 in the range of about 20 to 40 seconds (preferably about 30 seconds). At this first energy level E1, a good backside texture or "pit" density can be produced, as shown by the photograph in FIG. 7, which is magnified about 500 times. A lower first energy level E1 will produce a smaller "pit" density, such as that shown in the photograph of FIG. 8, which was produced with a first energy level E1 of about 2 $W/cm^2$ (the magnification of FIG. 8 is the same as FIG. 7). The even lower pit density of FIG. 9 is probably not particularly useful, since the pits are so sparse, but it is included to illustrate the results of using a first energy level E1 of about 1.5 $W/cm^2$. Of course, a higher first energy level E1 will produce an even greater "pit" density, but if E1 gets too high, such as approaching the energy level E2 in the range of about 3.0 to 4.0 $W/cm^2$, it could cause immediate uniform melting over the whole interface 10 area thereby enabling lateral dissipation of heat and avoiding local hot spots 19, thus getting a good, quick alloying of a thin layer 3, but not the desired texturing, at the interface 10.

Once the desired first energy level E1 is reached for the desired "pit" density formation, that energy level E1 is held fairly constant for a second time interval of about 10 to 30 seconds (preferably about 20 seconds duration extending from T1 to a second time T2. This second time interval of T1 to T2 at fairly constant first energy level E1 allows the "pits" 17 to develop and become larger and deeper at the local hot spots 19. Then, the energy level is increased at a rapid rate from the first energy level E1 to a second energy level E2 that is in the range of about 3.0 to 4.0 $W/cm^2$ (preferably about 3.5 $W/cm^2$) to get the thin alloy layer 3 by quickly melting the area 20 between the "pits" 17. This increase of energy from the E1 level to the E2 level can occur in a third time interval of about zero to 10 seconds duration (preferably about 5 seconds) extending from T2 to a third time T3.

The E2 energy level is held fairly constant for a fourth time interval of about 10 to 30 seconds duration (preferably about 20 seconds) extending from T3 to a fourth time T4, which is sufficient to achieve good alloying, but not so long as to allow the alloying layer 3 to get too thick or become too graded to reduce the optical reflectance. Finally, the energy level is reduced from E2 to zero in a fifth time interval of about 2 to 10 seconds duration (preferably about 5 seconds) to allow epitaxial crystal growth in the alloyed layer 3 to ensure low electrical resistivity between the silicon semiconductor material 1 and the aluminum electrical contact 2.

As mentioned above, other energy levels and time intervals may be appropriate for processing other semiconductor and metal contact materials within the scope of this invention.

While the method of this invention results in minimal heating of the atmosphere immediately surrounding the semiconductor device 4, it is preferred, though not required, to perform this alloying method in an inert environment, to eliminate any chance of contamination or oxidation. Such an inert environment could be created by providing the quartz chamber 6 with an inlet port 13 for the inlet of an inert gas, such as argon, and an outlet port 4 for an exit for the processing gas and provides a means for continually flowing the inert gas through chamber 6 during the one-sided infrared light texturing and alloying method according to the present invention.

The foregoing description is considered as illustrative only of the principles of the invention. Furthermore, since numerous modifications and changes will readily occur to those skilled in the art, it is not desired to limit the invention to the exact construction and process shown as described above. Accordingly, all suitable modifications and equivalents may be resorted to falling within the scope of the invention as defined by the claims which follow.

The embodiments of the invention in which an exclusive property or privilege is claimed are defined as follows:

1. A method of alloying a metal layer deposited on a second surface of a transparent semiconductor substrate that has a first surface and a second surface and of texturing said second surface, comprising the steps of:
    illuminating the first surface of the semiconductor substrate with electromagnetic radiation having a wavelength that is substantially transmitted by the semiconductor substrate and which is substantially absorbed at the interface of the metal layer with the second surface for a time duration and energy level schedule substantially as follows:
    increasing the energy level from an initial starting point of zero (0) to a first energy level E1 during an initial time interval from zero (0) to T1;
    holding said first energy level E1 for a second time interval extending from T1 to a second time T2;
    increasing the energy level at an increased rate from E1 to a second energy level E2 during a third time interval extending from T2 to a third time T3;
    maintaining the energy level E2 fairly constant during a fourth time interval extending from T3 to a fourth time T4; and
    decreasing the energy level from E2 back to zero (0) during a fifth time interval extending from T4 to a fifth time T5.

2. The method of claim 1, including the step of positioning said semiconductor substrate in an inert environment prior to the steps of illuminating the semiconductor substrate with electromagnetic radiation.

3. The method of claim 1, including the step of illuminating said semiconductor substrate with electromagnetic radiation from a direction normal to said second surface.

4. The method of claim 3, wherein said electromagnetic radiation includes wavelengths in the infrared region.

5. The method of claim 1, wherein said first energy level E1 is in the range of about 1.7 to 2.7 W/cm$^2$.

6. The method of claim 5, wherein said first energy level E1 is about 2.2 W/cm$^2$.

7. The method of claim 1, wherein said second energy level E2 is in the range of about 2.9 to 3.9 W/cm$^2$.

8. The method of claim 7, wherein said second energy level E2 is about 3.4 W/cm$^2$.

9. The method of claim 1, wherein said time T1 is in the range of about 20 to 40 seconds.

10. The method of claim 9, wherein said time T1 is about 30 seconds.

11. The method of claim 1, wherein the time interval from T1 to T2 is in the range of about 10 to 30 seconds.

12. The method of claim 11, wherein the time interval from T1 to T2 is about 20 seconds.

13. The method of claim 1, wherein the time interval from T2 to T3 is in the range of about 0 to 10 seconds.

14. The method of claim 13, wherein the time interval from T2 to T3 is about 5 seconds.

15. The method of claim 1, wherein the time interval from T3 to T4 is about 10 to 30 seconds.

16. The method of claim 15, wherein the time interval from T3 to T4 is about 20 seconds.

17. The method of claim 1, wherein the energy level is increased form zero to E1 at a fairly constant first rate of increase.

18. The method of claim 17, wherein the energy level is increased from E1 to E2 at fairly constant second rate of increase that is higher than said first rate of increase.

19. The method of claim 1, wherein the energy level is increased from E1 to E2 almost instantaneously.

20. The method of claim 1, wherein the energy level is decreased from E2 to zero at a fairly uniform rate of decrease.

21. The method of claim 1, to form local isolated hot spots at said interface that are high enough in temperature to melt both the semiconductor material and the metal to form "pits" in the semiconductor material, but insufficient energy to melt the semiconductor material and metal in a unitary manner over the entire interface area.

22. The method of claim 21, wherein said second energy level E2 is sufficient energy to melt the metal and semiconductor material over the entire interface area quickly enough to avoid melting entirely through the entire thickness of the metal or far enough into the semiconductor material to obliterate said "pits."

23. The method of claim 22, wherein second energy level E2 and the time interval T3 to T4 are sufficient to alloy a layer of silicon and aluminum about 100Å to 300Å thick.

24. The method of claim 23, wherein the time interval from T4 to T5 is sufficient to allow epitaxial growth of crystal structures in the Si—Al alloy layer.

25. A method of texturing a second surface of a semiconductor device that has a first side and a second side with a metal layer deposited on said second side to create a semiconductor/metal interface and of alloying semiconductor material with metal at said interface, comprising the steps of:
    illuminating said first side of said semiconductor with electromagnetic radiation having a wavelength to which the semiconductor material, but not the metal, is substantially transparent and at a first energy level that is sufficient to form local, isolated hot spots having temperatures high enough to form "pits" in said second surface by melting the semiconductor material and the metal at said hot spots and maintaining said first energy level for a sufficient time to allow said "pits" to form;
    increasing the energy of said illumination to a second energy level that is sufficient to quickly melt semiconductor material and metal over substantially the entire interface area including between said "pits," and maintaining said second energy level for a sufficient time to allow said melted semiconductor material and metal to form a then alloy layer between said semiconductor and said metal layer; and
    decreasing and removing the energy level of said illumination over a time that allows epitaxial crystal growth of said alloy layer.

* * * * *